(12) United States Patent
Fujita

(10) Patent No.: US 7,466,412 B2
(45) Date of Patent: Dec. 16, 2008

(54) METHOD OF DETECTING DISPLACEMENT OF EXPOSURE POSITION MARKS

(75) Inventor: Mutsumi Fujita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 149 days.

(21) Appl. No.: 11/542,073

(22) Filed: Oct. 3, 2006

(65) Prior Publication Data

US 2008/0002203 A1 Jan. 3, 2008

(30) Foreign Application Priority Data

Jun. 30, 2006 (JP) .............................. 2006-182530

(51) Int. Cl.
*G01B 11/00* (2006.01)
(52) U.S. Cl. .................. 356/399; 356/401; 257/797
(58) Field of Classification Search ............... 356/399, 356/401, 614, 619; 257/797
See application file for complete search history.

(56) References Cited

U.S. PATENT DOCUMENTS

| | | | |
|---|---|---|---|
| 6,022,650 A | 2/2000 | Sogawa | |
| 6,596,603 B1 * | 7/2003 | Narimatsu | 438/401 |
| 6,801,313 B1 * | 10/2004 | Yokota | 356/401 |
| 6,943,458 B2 * | 9/2005 | Narimatsu | 257/797 |
| 7,355,291 B2 * | 4/2008 | Adel et al. | 257/797 |
| 2004/0009411 A1 * | 1/2004 | Hibbs | 430/5 |
| 2006/0210885 A1 * | 9/2006 | Ziger et al. | 430/5 |

FOREIGN PATENT DOCUMENTS

| | | |
|---|---|---|
| JP | 2001-332466 A | 11/2001 |
| JP | 2003/243297 A | 8/2003 |

* cited by examiner

*Primary Examiner*—Roy M Punnoose
(74) *Attorney, Agent, or Firm*—Greer, Burns & Crain, Ltd.

(57) ABSTRACT

Exposure position marks are reliably recognized and the displacement of an exposure position is correctly and efficiently detected based on measurement results produced by recognizing the marks. The exposure position marks are constructed of a first pattern made up of an inner quadrangular pattern and an outer quadrangular pattern and a second pattern shaped as a rectangular frame whose inner edge and outer edge are formed as quadrangular patterns. The first pattern and the second pattern are formed with an intention of making center positions of the first pattern and the second pattern match and of having the second pattern disposed inside a region between an inner quadrangular pattern and an outer quadrangular pattern of the first pattern. The displacement of the exposure position is found by calculating an average of a measurement produced by detecting a displacement between the center positions of the inner quadrangular pattern of the first pattern and the quadrangular pattern that is the inner edge of the second pattern and a measurement produced by detecting a displacement between the center positions of the outer quadrangular pattern of the first pattern and the quadrangular pattern that is the outer edge of the second pattern.

6 Claims, 4 Drawing Sheets

METHOD OF DETECTING DISPLACEMENT OF EXPOSURE POSITION MARKS

BACKGROUND OF THE INVENTION

1. Field of the Invention

The present invention relates to a method of detecting displacement of exposure position marks, which are provided for detecting displacement of an exposure position, during the manufacturing of a semiconductor or a thin-film magnetic head.

1. Related Art

When manufacturing a semiconductor, a thin-film magnetic head, or the like, a required conductive pattern or insulating layer pattern is formed by photolithography. During the manufacturing of such devices, when laminating a conductive pattern or insulating layer pattern, displacement of the pattern is detected, it is judged whether the exposure position is within a tolerated range, and the displacement is fed back to the exposure apparatus so that the exposure operation can be carried out with high precision.

Displacement of exposure position marks is detected by forming the exposure position marks at positions that do not affect the products, such as at the edges of a work, carrying out image recognition for the exposure position marks provided on a lower layer and an upper layer, and detecting the displacement between the exposure position marks.

Exposure position marks can have various shapes. FIGS. 6A and 6B show examples where displacement is detected using quadrangular exposure position marks. FIG. 6A shows an example where square patterns are used and FIG. 6B shows an example where bar-shaped patterns are disposed in a quadrangular arrangement. In FIG. 6A, a square pattern 6 formed in a latter process is formed as a larger square than a square pattern 5 that has been formed in a former process so that the square pattern 5 is positioned inside the square pattern 6. In FIG. 6B, patterns 8 formed in the latter process are disposed so as to surround bar-shaped patterns 7 that have been formed in the former process.

In either of FIGS. 6A and 6B, the center positions of the square patterns 5 and 6 and the center positions of the quadrangles surrounded by the bar shaped patterns 7 and 8 are respectively detected and the displacement of the exposure position is detected from the displacement of the center positions.

Patent Document 1

Japanese Laid-Open Patent Publication No. H11-126746

Patent Document 2

Japanese Laid-Open Patent Publication No. 2001-332466

Patent Document 3

Japanese Laid-Open Patent Publication No. 2003-243297

SUMMARY OF THE INVENTION

Although the exposure position marks formed in the former process are smaller than the exposure position marks formed in the latter process in FIGS. 6A and 6B, large marks may be formed in the former process and small marks may be formed in the latter process. By changing the size of the marks and disposing the smaller marks inside the larger marks, it is possible to detect the exposure position marks by scanning a single image, with the displacement then being detected from such detected positions of the marks.

As shown in FIGS. 6A and 6B, when the center positions of the marks formed in the former process and the latter process are displaced, for example, when displacement is detected for the positions shown in FIGS. 6A and 6B, in principle the same displacement should be detected when detecting the displacement using the arrangement shown in FIGS. 6A and 6B and when detecting the displacement after rotating the arrangement shown in FIGS. 6A and 6B by 180°. In reality however, the same detection result is not always obtained. For this reason, in some cases the displacement is calculated by averaging a measurement result produced by image recognition of the marks from a predetermined direction and a measurement result obtained from positions rotated by 180°.

Such fluctuations can be caused by the shape of the patterns wherein it is not possible to properly detect edge parts and the like of the patterns when image recognition is carried out for the exposure position marks, and can also be due to unavoidable causes when measuring the exposure position marks. Such unavoidable causes are thought to be (i) aberration of the lenses used in the measurement optical system, (ii) the exposure position marks having different positions in the height direction due to the marks formed in the former process and the latter process being formed at different positions in the laminating direction, and (iii) the shapes of the marks being recognized differently depending on the measurement direction due to the exposure position marks being formed with predetermined thicknesses.

Marks composed of the bar-shaped patterns shown in FIG. 6B are used to make it easier to recognize the mark positions compared to marks composed of square patterns, especially when the marks have a small thickness. However, even when the shape of the marks is changed in this way, it is still not possible to eliminate the fluctuations in the measurements due to the measurement apparatus, the thickness of the marks, and the like.

When manufacturing a semiconductor or a thin-film magnetic head, patterns are presently controlled at the nanometer level. In this way, when extremely high precision is required for positioning, it becomes necessary to also control fluctuations in measurements caused by the measurement method that conventionally did not cause a problem.

To evaluate the positioning, it is important not only to have measurement precision but also to faithfully reflect the positioning marks in an actual device. Lens aberration (such as coma aberration) in an exposure apparatus can produce displacement in the exposure position from the pattern dimensions. With conventional box marks, since it is necessary to form two patterns (i.e., a large pattern and a small pattern), there is the possibility of a displacement being produced by aberration of the exposure apparatus aside from any displacement on the manufactured device itself.

The present invention was conceived to solve the problem described above and it is an object of the present invention to provide a method of detecting a displacement of exposure position marks that can reliably recognize exposure position marks that enable the displacement to be detected and can correctly and efficiently detect the displacement of an exposure position based on measurement results produced by recognizing the marks.

To achieve the stated object, a method of detecting a displacement of exposure position marks according to the present invention detects exposure position marks formed on a work in a former process and a latter process and detects a displacement of an exposure position from a displacement of the exposure position marks, wherein the exposure position marks are constructed of a first pattern made up of an inner quadrangular pattern and an outer quadrangular pattern and a second pattern shaped as a rectangular frame whose inner edge and outer edge are formed as quadrangular patterns, in the former process and the latter process, one of the first pattern and the second pattern is formed with an intention of making center positions of the first pattern and the second pattern match and of having the second pattern disposed inside a region between an inner quadrangular pattern and an outer quadrangular pattern of the first pattern, and the displacement of the exposure position is found, based on a result of detecting images of the exposure position marks, by calculating an average of a measurement produced by detecting a displacement between the center positions of the inner quadrangular pattern of the first pattern and the quadrangular pattern that is the inner edge of the second pattern and a measurement produced by detecting a displacement between the center positions of the outer quadrangular pattern of the first pattern and the quadrangular pattern that is the outer edge of the second pattern.

It is also effective to form the quadrangular patterns as square patterns, or in place of quadrangular patterns, to form bar-shaped patterns in quadrangular arrangements.

Another method of detecting a displacement of exposure position marks according to the present invention detects exposure position marks formed on a work in a former process and a latter process and detects a displacement of an exposure position from a displacement of the exposure position marks, wherein the exposure position marks are constructed of a first pattern made up of a pair of quadrangular patterns and a second pattern made up of another pair of quadrangular patterns in a crisscross arrangement with the first pattern, in the former process and the latter process, one of the first pattern and the second pattern is formed with an intention of making center positions of the first pattern and the second pattern match, and the displacement of the exposure position is calculated, based on a result of detecting images of the exposure position marks, from an average of a measurement obtained by detecting a center position of the first pattern and a measurement obtained by detecting a center position of the second pattern.

It is also effective to form the quadrangular patterns as square patterns with equal dimensions, or in place of quadrangular patterns, to form bar-shaped patterns in quadrangular arrangements.

According to the method of detecting a displacement of exposure position marks according to the present invention, when using exposure position marks where a first pattern and a second pattern are relatively positioned inside and outside one another, it is possible to calculate the displacement so as to cancel out fluctuations based on the relative positions of the first pattern and the second pattern, and therefore the displacement of the exposure position marks can be detected with high precision. By using a construction where patterns are disposed on two layers and disposing the patterns in a crisscross arrangement, it is possible to obtain the displacement as the average of the center positions of the patterns, thereby improving the precision with which the displacement can be detected.

BRIEF DESCRIPTION OF THE DRAWINGS

The aforementioned and other objects and advantages of the present invention will become apparent to those skilled in the art upon reading and understanding the following detailed description with reference to the accompanying drawings.

In the drawings.

DESCRIPTION OF THE PREFERRED EMBODIMENTS

Preferred embodiments of the present invention will now be described in detail with reference to the attached drawings.

First Embodiment

FIGS. 1A to 1F show examples of exposure position marks that are formed in a former process and in a latter process to enable displacement of the marks to be detected, according to the method of detecting displacement of exposure position marks according to the present invention.

Figure 1A:
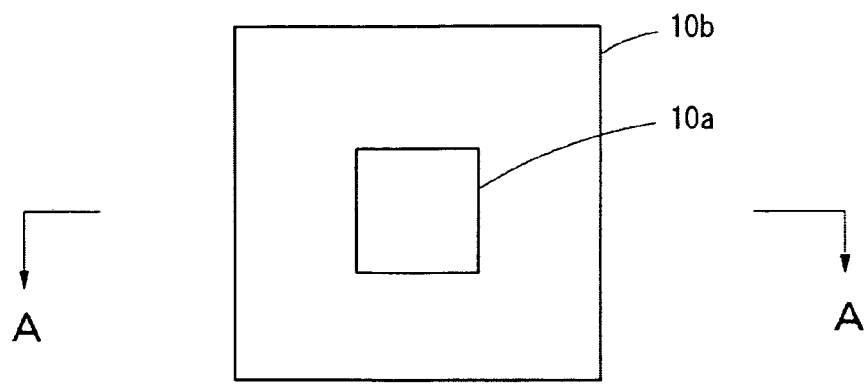
FIGS. 1A to 1F are diagrams useful in explaining the construction of marks used when detecting the displacement of exposure position marks.

FIG. 1A shows the exposure position marks formed in the former process. These exposure position marks are formed so that the center positions of two, (i.e., a large and a small) square patterns 10a and 10b match and are disposed so that the edges of the patterns 10a and 10b are parallel.

Figure 1B:
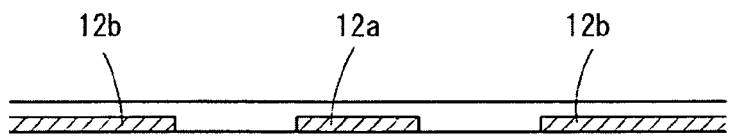
Figure 1C:

FIGS. 1B and 1C are cross-sectional views taken along the line A-A in FIG. 1A and show examples of where the square patterns 10a and 10b are formed on a base layer. FIG 1B shows an example where a pattern 12a that forms the inner square pattern 10a and a pattern 12b that forms the outer square pattern 10b are formed. FIG. 1C shows an example where a frame-shaped pattern 12c is formed on the base layer to form the inner square pattern 10a and the outer square pattern 10b. Since the square patterns 10a and 10b appear as the edge parts of the patterns, the patterns can be formed as convex patterns with respect to the base layer as shown in FIG. 1B or as a concave pattern with respect to the base layer as shown in FIG 1C.

The patterns 12a, 12b, and 12c that form the exposure position marks can be various different patterns according to the manufacturing process used, with there being no particular limitations on the method of forming the exposure position marks. That is, during a process that forms a conductive pattern, such exposure position marks may be produced by forming conductive patterns and/or during a process that forms an insulating layer, such exposure position marks may be produced by forming the insulating layer in a predetermined pattern. It is also possible to provide a resist layer for patterning into a predetermined pattern and to expose and develop the resist to form a resist pattern.

Figure 1D:
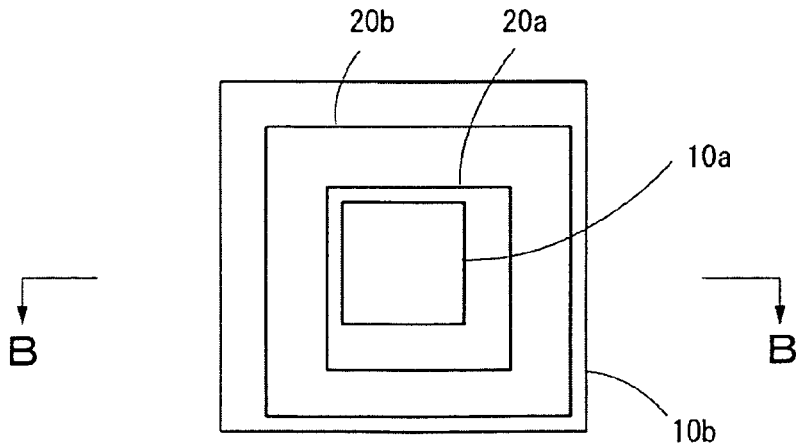

FIG. 1D shows a state where exposure position marks have been formed in the latter process after positioning on the exposure position marks formed in the former process. The exposure position marks formed in the latter process are produced by forming a square frame whose inner and outer edges are the square patterns 20a and 20b. The square patterns 20a and 20b are formed with matching center positions and with edges that are parallel.

As shown in the drawings, the square patterns 20a and 20b formed in the latter process are formed within a frame-shaped region bordered by the inner square pattern 10a and the outer square pattern 10b formed in the former process with the intention of making the center positions of the patterns formed in the former process and the latter process match.

Figure 1E:
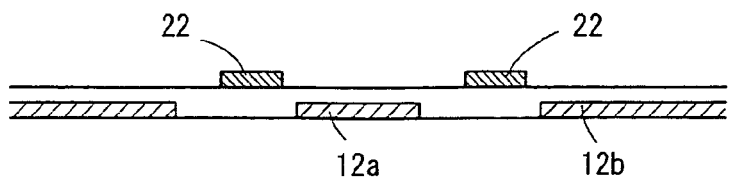
Figure 1F:
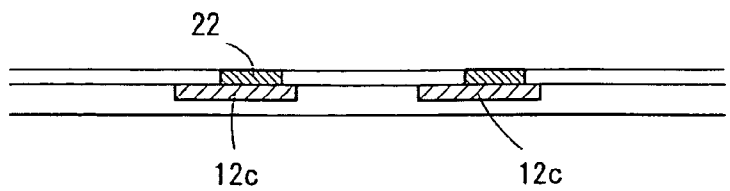

FIGS. 1E and 1F are cross-sectional views taken along the line B-B in FIG. D and show a state where a pattern 22 is formed on an upper layer of the square patterns 10a and 10b formed in the former process so that the square patterns 20a and 20b are displayed. The pattern 22 is formed in a square frame-like shape.

In this way, according to a method that forms two layers of square patterns so that the exposure position marks in the former process and the latter process are concentrically disposed and then detects any displacement from the center position of the square patterns, compared to a method that detects the displacement using a conventional single layer of square patterns, it is possible to detect displacement with high precision.

Method of Detecting Displacement

In the present embodiment, displacement is detected as follows. That is, (1) the center positions of the inner square pattern 10a formed in the former process and the inner-edge square pattern 20a formed in the latter process are detected and the displacement between the center positions (measurement D1) is detected, (2) the center positions of the outer square pattern 10b formed in the former process and the outer-edge square pattern 20b formed in the latter process are detected and the displacement between the center positions (measurement D2) is detected, and (3) the average of the measurements D1 and D2 is calculated and set as the displacement of the exposure position.

By comparing the measurement D1 detected by the measurement method of (1) and the measurement D2 detected by the measurement method of (2), the relative positions of the square pattern formed in the former process and the square pattern formed in the latter process are reversed and therefore the following relationship is established between the measurement D1 and the measurement D2.

(Measurement $D1$)=(true value)+(shift $\alpha$)+(shift $\beta$)

(Measurement $D2$)=−(true value)+(shift $\alpha$)−(shift $\beta$)

Since the arrangement of the square patterns is reversed, the measurement D2 is a negative value. Shift $\alpha$ appears due to the relative positional relationship between the square pattern formed in the former process and the square pattern formed in the latter process and shift $\beta$ appears due to the measurement system or the like.

The measurement D1 and the measurement D2 are averaged and the displacement of the square patterns 10a and 10b and the square patterns 20a and 20b is expressed by the following equation.

(Measurement $D$)={(Measurement $D1$)−(Measurement $D2$)}/2=(Real Value)+(Shift $\beta$)

That is, by averaging the measurement D1 and the measurement D2, the shift $\alpha$ due to the relative positional relationship of the square patterns is cancelled out to leave only the shift $\beta$ due to the thickness of the patterns and the measurement system.

Figure 2:
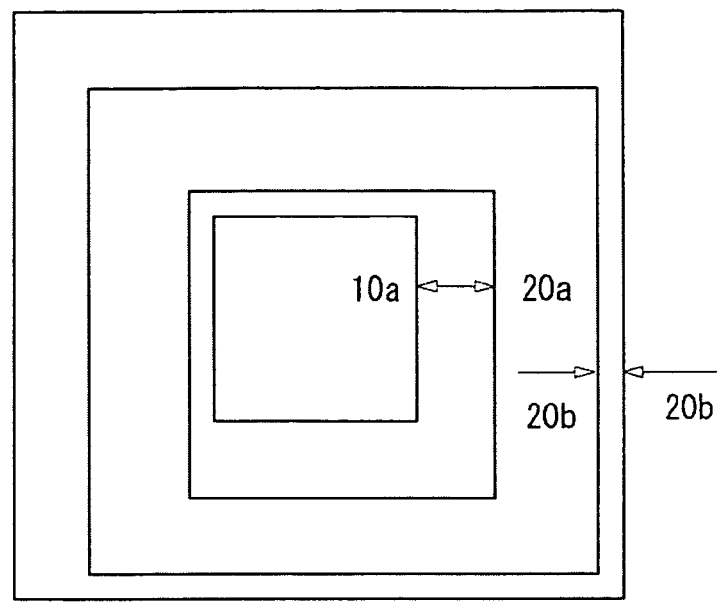
FIG. 2 is a plan view showing an example of square patterns used as the exposure position marks.

FIG. 2 shows the relative positional relationship between the square patterns 10a and 10b and the square patterns 20a and 20b. In the embodiment described above, the square patterns 10a and 10b are formed in the former process and the square patterns 20a and 20b are formed in the latter process. A method that detects the displacement based on square patterns disposed on two layers relates to only the relative positional relationship of the square patterns and is not dependent on the order in which the square patterns are formed.

The method of detecting a displacement according to the present embodiment described above is characterized by using the square patterns 10a and 10b as a first pattern and the square patterns 20a and 20b as a second pattern, finding the measurement D1 from the positional relationship of part of the second pattern outside the first pattern, and finding the measurement D2 from the positional relationship of part of the first pattern outside the second pattern so that the relative positional relationship of the patterns is reversed for the measurement D1 and the measurement D2. Accordingly, by averaging such measurements, errors due to the relative arrangement being such that the first pattern and the second pattern are inside and outside each other can be cancelled out, thereby improving the measurement precision.

Also, according to the method of detecting a displacement according to the present embodiment, by using two layers of square patterns, the displacement is detected from the data of two sets of square patterns, so that fluctuations due to random causes can also be reduced. This means that compared to the conventional method where the displacement is detected from data of only one set of square patterns, by using the method of detecting a displacement according to the present embodiment, it is possible to improve the precision for detecting the displacement.

Second Embodiment

Figure 3:
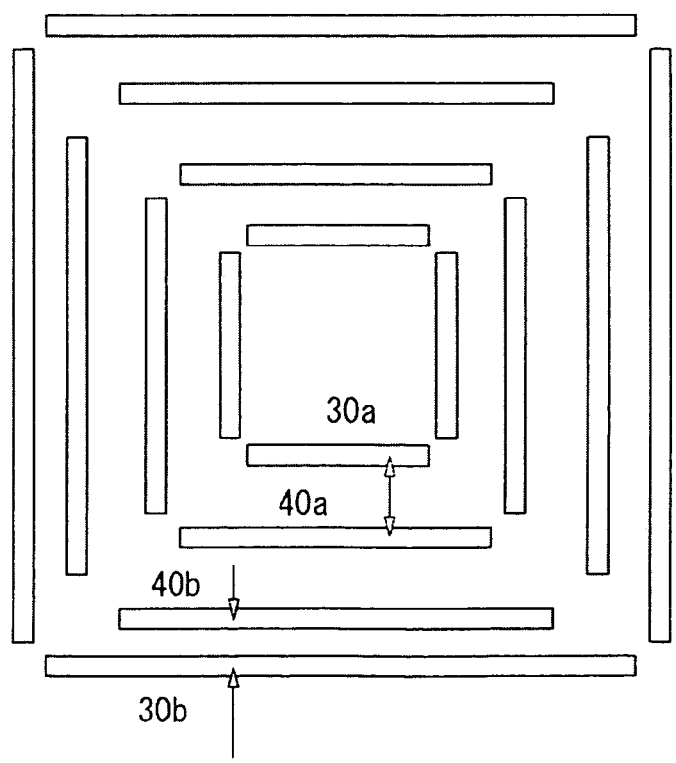
FIG. 3 is a plan view showing an example of bar-shaped patterns used as the exposure position marks.

FIG. 3 shows another example of exposure position marks used by the method of detecting a displacement of exposure position marks according to the present invention. The exposure position marks used in the present embodiment are composed of bar-shaped patterns that are disposed in quadrangular arrangements where a quadrangular arrangement of bar-shaped patterns 30a on the inside and a quadrangular arrangement of bar-shaped patterns 30b on the outside are used as the first pattern and a quadrangular arrangement of bar-shaped patterns 40a on the inside and a quadrangular arrangement of bar-shaped patterns 40b on the outside are used as the second pattern.

The patterns 30a and 30b are formed in square arrangements so that the center positions of the respective quadrangular arrangements match and the edges of the arrangements are parallel. The patterns 40a and 40b are also formed in square arrangements so that the center positions of the respective quadrangular arrangements match and the edges of the arrangements are parallel. The patterns 40a and 40b that form the second pattern are disposed inside a frame-shaped region surrounded by the patterns 30a and 30b that form the first pattern.

The first pattern and the second pattern may be formed in either the former process or the latter process and are formed with the intention of making the center positions of the first pattern and the second pattern match.

With the present embodiment also, by detecting the center positions of the quadrangles composed of the pattern 30a that is part of the first pattern and the pattern 40a that is part of the second pattern, detecting the center positions of the quadrangles composed of the pattern 30b that is part of the first pattern and the pattern 40b that is part of the second pattern, and averaging the measurements, it is possible to detect the displacement of the exposure position with high precision in the same way as in the first embodiment.

Third Embodiment

Figure 4:
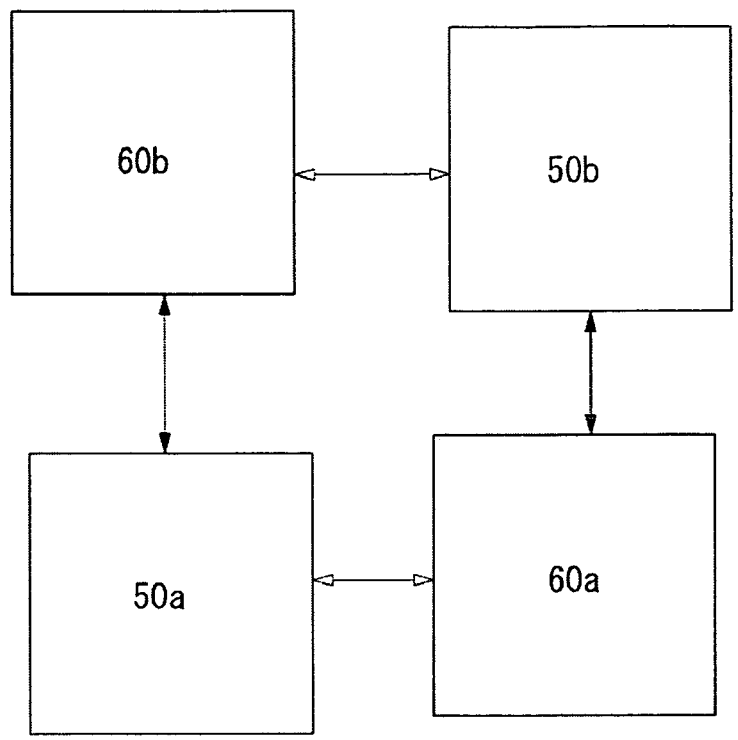
FIG. 4 is a plan view showing an example where square patterns are disposed in a crisscross arrangement as the exposure position marks.

FIG. 4 shows another example of exposure position marks used by the method of detecting a displacement of exposure position marks according to the present invention. The exposure position marks in the present embodiment are an example where square patterns 50a and 50b that are the first pattern and square patterns 60a and 60b that are the second pattern are formed with the same shape and the same size and are disposed in a crisscross arrangement.

The first pattern and the second pattern are exposure position marks that are formed in different steps. The first pattern and the second pattern are formed so that the center of respective center positions of the square patterns 50a and 50b that are the first pattern and the center of the respective center positions of the square patterns 60a and 60b that are the second pattern match.

When detecting the displacement, image recognition is carried out for the square patterns 50a and 50b that form the first pattern and the square patterns 60a and 60b that form the second pattern to detect the respective center positions, the displacement between the center position of the pair of square patterns 50a and 50b and the center position of the pair of square patterns 60a and 60b is detected, and the detected displacement is set as the displacement of the exposure position. By disposing the square patterns 50a and 50b and the square patterns 60a and 60b in a crisscross arrangement, it is possible to detect the displacement of the exposure position as the displacement of the center positions.

Figure 6A:
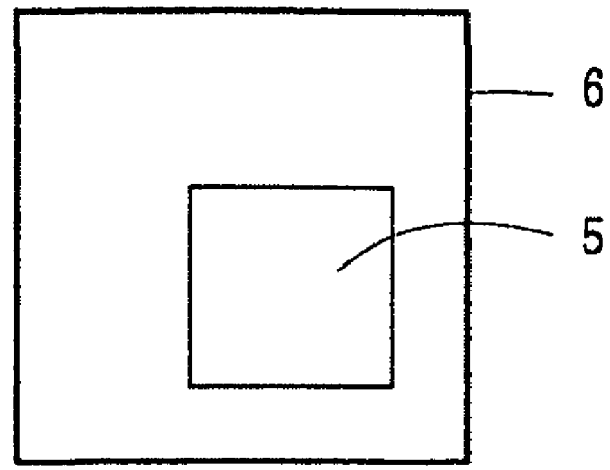
FIGS. 6A and 6B are plan views showing conventional exposure position marks.
Figure 6B:
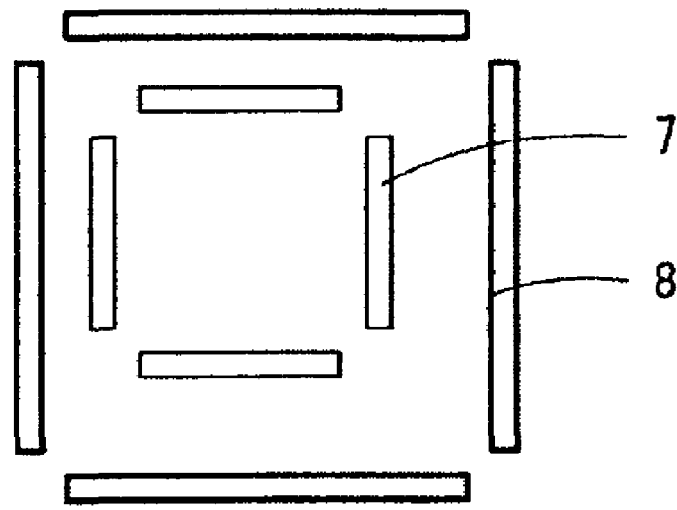

In the present embodiment, since the displacement of the exposure position is detected based on a center position found from the pair of square patterns 50a and 50b and a center position found from the other pair of square patterns 60a and 60b, compared to the method that detects the displacement based on a single pair of quadrangular patterns such as that shown in FIG. 6, it is possible to improve the detection precision of the displacement.

In the present embodiment, using squares of the same size as the exposure position marks has an advantage compared to when square patterns with different sizes such as those shown in FIG. 1 are formed in that it is easy to form the marks.

In the present embodiment, marks with the same dimensions are formed in the former process and in the latter process, which has an advantage in that the marks are not affected by aberration of the exposure apparatus or the process used.

Fourth Embodiment

Figure 5:
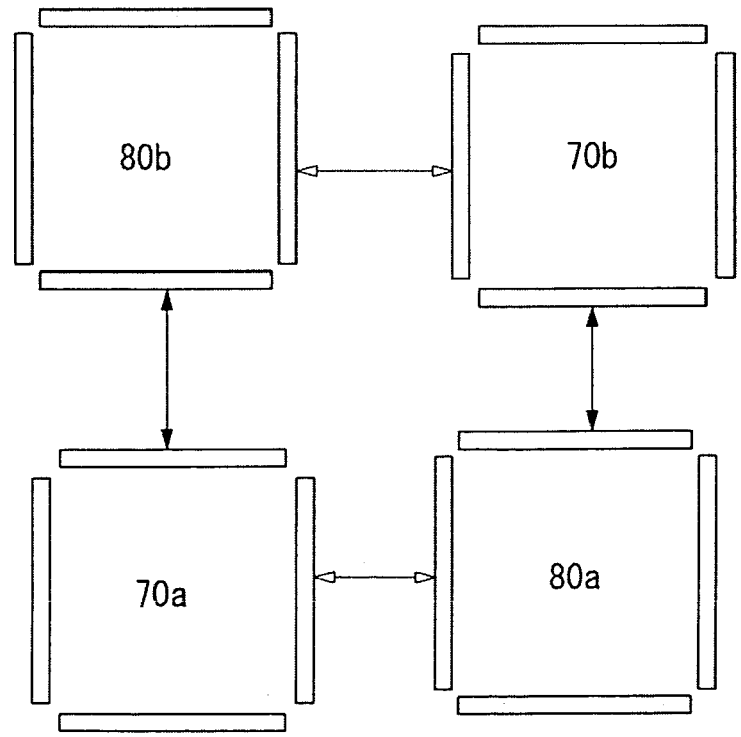
FIG. 5 is a plan view showing an example where bar-shaped patterns are disposed in a crisscross arrangement as the exposure position marks.

FIG. 5 shows an example of an arrangement that is a modification of the third embodiment and uses quadrangular arrangements of bar-shaped patterns in place of the square patterns. In the present embodiment, patterns 70a and 70b produced by forming bar-shaped patterns in quadrangular arrangements are formed as the first pattern and patterns 80a and 80b produced by forming bar-shaped patterns in quadrangular arrangements are formed as the second pattern. The patterns 70a and 70b and the patterns 80a and 80b all have the same square arrangements. The first patterns and the second patterns are formed with a crisscross arrangement with the intention of making the center positions of the patterns match.

In the present embodiment, in the same way as in the third embodiment, image recognition is carried out for the patterns 70a and 70b and the patterns 80a and 80b, the center positions of the quadrangular arrangements constructed of the respective patterns are detected, and the displacement in the exposure position is detected based on the center position calculated from the pair of patterns 70a and 70b and the center position calculated from the other pair of patterns 80a and 80b. In the present embodiment also, since the patterns are formed with the same shapes, there is the advantage that it is easy to form the patterns since it is not necessary to form patterns in quadrangular arrangements with different sizes such as those shown in FIG. 3. Also, by detecting the center positions for pairs of patterns, it is possible to detect the displacement in the exposure position with high precision.

What is claimed is:

1. A method of detecting a displacement of exposure position marks that detects exposure position marks formed on a work in a former process and a latter process and detects a displacement of an exposure position from a displacement of the exposure position marks, wherein the exposure position marks are constructed of a first pattern made up of an inner quadrangular pattern and an outer quadrangular pattern and a second pattern shaped as a rectangular frame whose inner edge and outer edge are formed as quadrangular patterns, in the former process and the latter process, one of the first pattern and the second pattern is formed to make center positions of the first pattern and the second pattern match and have the second pattern disposed inside a region between an inner quadrangular pattern and an outer quadrangular pattern of the first pattern, and the displacement of the exposure position is determined, based on a result of detecting images of the exposure position marks, by calculating an average of a measurement produced by detecting a displacement between the center positions of the inner quadrangular pattern of the first pattern and the quadrangular pattern that is the inner edge of the second pattern and a measurement produced by detecting a displacement between the center positions of the outer quadrangular pattern of the first pattern and the quadrangular pattern that is the outer edge of the second pattern.

2. A method of detecting a displacement of exposure position marks according to claim 1, wherein the quadrangular patterns are formed as square patterns.

3. A method of detecting a displacement of exposure position marks according to claim 1, wherein in place of quadrangular patterns, bar-shaped patterns are formed in quadrangular arrangements.

4. A method of detecting a displacement of exposure position marks that detects exposure position marks formed on a work in a former process and a latter process and detects a displacement of an exposure position from a displacement of the exposure position marks, wherein the exposure position marks are constructed of a first pattern made up of a pair of quadrangular patterns and a second pattern made up of another pair of quadrangular patterns in a crisscross arrangement with the first pattern, in the former process and the latter process, one of the first pattern and the second pattern is formed to make center positions of the first pattern and the second pattern match, and the displacement of the exposure position is determined, based on a result of detecting images of the exposure position marks, from an average of a measurement obtained by detecting a center position of the first pattern and a measurement obtained by detecting a center position of the second pattern.

5. A method of detecting a displacement of exposure position marks according to claim 4, wherein the quadrangular patterns are formed as square patterns with equal dimensions.

6. A method of detecting a displacement of exposure position marks according to claim 4, wherein in place of quadrangular patterns, bar-shaped patterns are formed in quadrangular arrangements.

* * * * *